United States Patent [19]

Wilcox

[11] 3,908,171

[45] Sept. 23, 1975

[54] AMPLIFIER CIRCUIT SUITABLE FOR AMPLIFYING DIFFERENTIAL INPUT SIGNALS AND PROVIDING A SINGLE ENDED OUTPUT SIGNAL

[75] Inventor: Milton E. Wilcox, Tempe, Ariz.

[73] Assignee: Motorola, Inc., Chicago, Ill.

[22] Filed: Dec. 3, 1973

[21] Appl. No.: 421,368

[52] U.S. Cl. .................. 330/14; 330/19; 330/30 D

[51] Int. Cl.[2] ...................... H03F 3/04; H03F 3/343

[58] Field of Search ......... 330/30 D, 14, 16, 18, 19, 330/22

[56] References Cited

UNITED STATES PATENTS

| | | | |
|---|---|---|---|
| 3,371,286 | 2/1968 | Lovelace | 330/15 |
| 3,546,484 | 12/1970 | Fowler et al. | 330/22 |
| 3,581,218 | 5/1971 | Ransdell | 330/30 D |
| 3,735,151 | 5/1973 | Frederiksen et al. | 330/30 D |

*Primary Examiner*—Stanley D. Miller, Jr.
*Attorney, Agent, or Firm*—Vincent J. Rauner; Maurice J. Jones, Jr.

[57] ABSTRACT

The amplifier circuit, which is suitable for manufacture in monolithic form, converts a differential driving signal having an arbitrary D.C. level into a single-ended output signal having a predetermined D.C. level. Included within the amplifier circuit are first and second stages, each having an input terminal coupled to one of the output terminals of a differential driving source through a zener diode which prevents the differential driving source from being saturated. The output terminal of the first stage is coupled to the input terminal of the second stage. Currents having predetermined relationships to each other are coupled to the second stage to prevent non-linear operation in response to input signals having small magnitudes. A reference voltage supply is coupled to the output terminal of the amplifier for establishing the predetermined D.C. output level.

10 Claims, 2 Drawing Figures

AMPLIFIER CIRCUIT SUITABLE FOR AMPLIFYING DIFFERENTIAL INPUT SIGNALS AND PROVIDING A SINGLE ENDED OUTPUT SIGNAL

BACKGROUND OF THE INVENTION

The differential output signals of solid state, low level differential driving circuits, such as synchronous demodulators, have direct current (D.C.) components with signal components superimposed thereon. If the differential driving circuit is powered by a low voltage power supply, the signal components at the output terminals thereof may not have a large enough magnitude to directly drive final output circuitry. Such output circuitry could include, for instance, a color system, a final video amplifier, a synchronizing circuit and an automatic gain control (AGC) circuit. The low level magnitude of the output signal is a result of the driving circuit, such as a synchronous demodulator, having output D.C. levels approaching one of the power supply potentials. Moreover, it is difficult to develop signal components at the output terminals of a synchronous demodulator while retaining wide bandwidths even if the power supply voltage is increased. This is because the R.C. time constant caused by the large load resistances required to produce larger output signals necessarily "roll-off" the frequency response of such amplifiers. In addition, the D.C. component at the output terminal of the differential driving source may not be compatible with the requirements of the final output circuitry. Therefore, an amplifier circuit is usually connected between the output terminals of a differential driving circuit and the input terminals of a final output stage to provide amplification of the driving signal and to provide the proper bias level to the final output stage. Moreover, such amplifier circuits may be required to convert the differential driving signal into a single-ended driving signal.

Prior art integrated amplifier circuits following NPN differential driving sources, such as synchronous demodulators, have used single-ended circuits which include lateral PNP transistors for shifting the relatively high positive D.C. level at the output of such circuits to a more negative D.C. level. Although such circuits are relatively uncomplicated, the use of the PNP transistors creates problems. One problem is caused by the single-ended coupling which results in a D.C. level at the output terminal of the amplifier which depends on the quiescent voltage level at the output terminal of the driving circuit. Consequently, the D.C. component of the amplifier output voltage undesirably varies with the integrated circuit manufacturing process of the driving circuit and with variations in the supply voltage.

The poor frequency response of lateral PNP integrated circuit transistors also creates problems. More specifically, it results in changes in gain and in phase of the amplified signal components with changes in the D.C. level at the output terminal of the differential driving circuit. More specifically, the unit gain cut-off frequency ($F_T$) of integrated circuit lateral PNP transistors is within the range extending from 3 to 5 megahertz (MHz) and depends on the integrated circuit manufacturing process. Because the $F_T$ of such PNP transistors is sensitive to the D.C. component of the collector currents thereof, the high frequency characteristic of such transistors change with the amount of current conducted therethrough. Consequently, some prior art amplifier circuits which utilize PNP transistors have non-linear gain and phase characteristics at frequencies between 3 and 5 MHz due to the effective base and emitter capacitances of the PNP structures.

The color signal utilized in television transmission utilizes a 3.58 megahertz chroma subcarrier signal, which is superimposed on the luminance signal. Color information is contained both in the phase and the amplitude of the 3.58 MHz signal. In order that the colors be reproduced correctly, it is important that the video amplifier connected to the video demodulator not change either the gain or the phase of the color signal. If the gain or the phase of the color signal is changed as the output signals of the video detector and the video amplifier are taken from the white level to the black level, then the amplifier output signal is said to respectively have a "differential gain" or a "differential phase" error. Prior art video amplifiers utilizing PNPs have undesirable differential gain and differential phase errors.

SUMMARY OF THE INVENTION

One object of this invention is to provide an improved amplifier circuit.

Another object of this invention is to provide an improved amplifier circuit suitable for being manufactured in monolithic integrated circuit form and for amplifying a television video signal without producing distortion of the phase of the chroma subcarrier signal.

Still another object of this invention is to provide an improved video amplifier circuit which has linear phase and amplitude amplification characteristics over a wide bandwidth.

A further object of this invention is to provide an amplifier circuit which has a stable quiescent output voltage level that is independent of the magnitude of the voltage supply.

A still further object is to provide an amplifier circuit which converts a differential input signal superimposed on an arbitrary D.C. level into a single-ended output signal superimposed on a predetermined D.C. level.

An additional object is to provide an amplifier circuit having NPN transistors which is suitable for amplifying luminance and color subcarrier signals occurring at the differential output terminals of a monolithic synchronous detector and which utilizes no PNP transistors.

The amplifier circuit, which is suitable for manufacture in monolithic integrated circuit form, converts a differential driving signal having an arbitrary D.C. level into a single-ended output signal having a predetermined D.C. level. Included within the amplifier circuit are first and second stages, each having an input terminal coupled to one of the output terminals of a differential driving source through a zener diode which prevents the differential driving source from being saturated. The output terminal of the first stage is coupled to the input terminal of the second stage. The differential signal current to the first stage decreases as the output signal increases. Consequently, the voltage at the output terminal of the first stage increases. The differential input current to the second stage increases as the output signal increases. Consequently, another increasing voltage is provided at the output terminal of the first stage. These two increasing voltages combine to provide a net increased input voltage to the second stage which responds by providing a decreasing amplifier output voltage, which could be utilized to form a negative going video signal. Bias currents having predetermined relationships to each other are coupled to the second stage to prevent non-linear operation of the amplifier in response to input signals having small magnitudes. A reference voltage supply is coupled to the output terminal of the amplifier for establishing the predetermined D.C. output level, which may correspond to the white level of a television video signal.

DETAILED DESCRIPTION OF THE PREFERRED EMBODIMENT

Figures 1, 2:
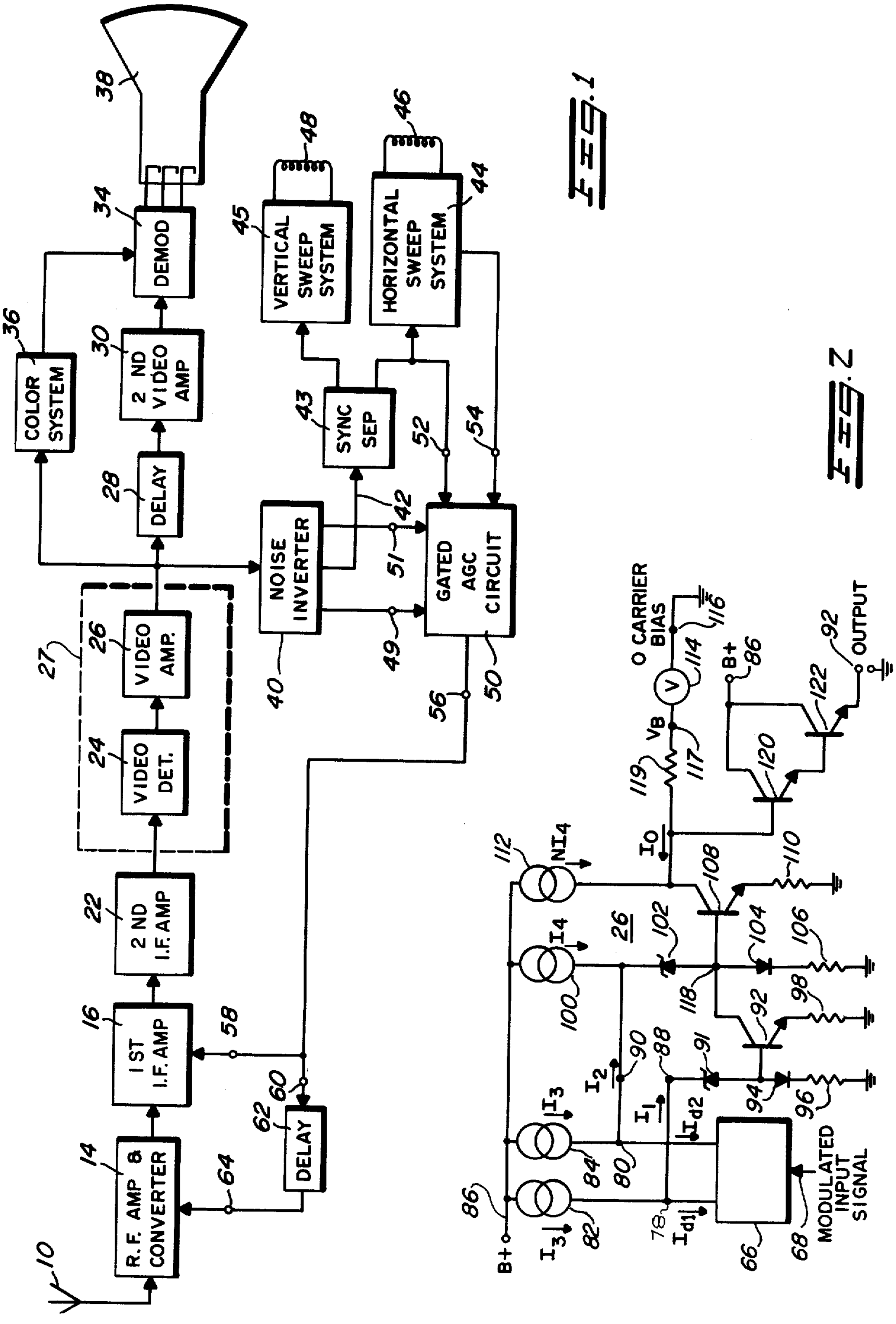
FIG. 1 is a partial block diagram of a television receiver which could include a video amplifier arranged in accordance with the invention.
FIG. 2 is a schematic diagram of an amplifier circuit of one embodiment of the invention which is utilized as a video amplifier.

Referring now to the drawing, FIG. 1 shows a partial block diagram of a typical color television receiver in which an incoming signal is received by antenna 10 and is applied to a radio frequency (R.F.) amplifier and converter stage 14 which amplifies and reduces the frequency of the received signals to provide intermediate frequency (I.F.) signals at its output terminal. The I.F. signals which include an amplitude modulated I.F. carrier having a frequency on the order of 45.75 megahertz (MHz) are then amplified by I.F. amplifiers 16 and 22. The amplitude modulation of the output signal of I.F. amplifier 22 is demodulated or detected by video detector 24.

The demodulated composite video signal is then amplified by video amplifier 26, which is shown in schematic form in FIG. 2. Video detector 24 and video amplifier 26 may be included within a common integrated circuit structure as indicated by dashed block 27 of FIG. 1. The brightness or luminance components of the composite video signal are applied to the input terminal of delay circuit 28 and then delayed for purposes well-known to those skilled in the art. Next, the brightness signal components are amplified by another or final video amplifier 30 and applied to a first input of demodulator circuit 34. The output signal of video amplifier 26 is also applied through color system 36 to a second input of demodulator circuit 34. Red, blue and green color signals are provided to the three cathodes of cathode ray tube 38 by demodulator 34.

Video amplifier 26 also supplies the composite video signal to moise inverter 40, which detects noise signals having magnitudes in excess of the magnitude of the signal synchronizing components of the composite video signal. The detected noise pulses are then utilized to actuate a "clamp circuit" which limits the magnitude of the composite video signal applied to terminal 42 of synchronizing signal separator 43. Horizontal and vertical synchronizing signal components are derived by sync separator 43 and supplied to horizontal and vertical sweep systems 44 and 45. The sweep systems 44 and 45 develop horizontal sweep signals at horizontal deflection windings 46 and vertical sweep signals at vertical deflection winding 48. Windings 46 and 48 are placed on the neck of cathode ray tube 38. The horizontal synchronizing pulses are applied to terminal 52 of AGC circuit 50. The composite video output signal from noise inverter 40 is applied to terminal 49 of gated automatic gain control (AGC) circuit 50 and the detected noise pulses are applied to terminal 51 of circuit 50. The horizontal flyback pulses are coupled from the horizontal sweep system 44 to terminal 54 of gated AGC circuit 50.

A gain control voltage is developed by circuit 50 at AGC output terminal 56. This gain control signal changes in amplitude according to the changes in peak amplitude of the synchronizing pulse components at the output of video detector 24, which are present during the gating intervals established by the flyback pulses. The strength and magnitude of the synchronizing pulses in turn is dependent upon the strength of the incoming signal occurring at antenna 10 so that the AGC voltage occurring at output terminal 56 of AGC circuit 50 is normally representative of the input signal strength. Depending on the nature of R.F. amplifier and converter 14 and first video I.F. amplifier 16, the gain control voltage at output terminal 56 may be a forward or a reverse control voltage.

AGC voltage is applied to control terminal 58 of first video I.F. amp 16 and to input terminal 60 of delay circuit 62. After appropriate delay, the AGC voltage is applied by delay circuit 62 to control terminal 64 of R.F. amplifier and converter circuit 14. Thus, the gain control voltage operates initially to control the gain of video I.F. stage 16 and, for increasing signal levels, operates to control the gain of the R.F. and converter stage 14 in a manner which is known in the art.

The structure and operation of the amplifier circuit of one embodiment of the invention will be explained with respect to an application associated with a video detector such as video detector 24 of FIG. 1. More specifically, FIG. 2 shows a video detector including synchronous amplitude modulation (A.M.) demodulator 66 which may be of a form well-known in the prior art such as disclosed by U.S. Pat. No. 3,697,685, which is entitled "Synchronous A.M. Detector" and which issued on Oct. 10, 1972 and is assigned to the assignee of the subject application.

Synchronous demodulator 66 receives a modulated input signal at input terminal 68 which has a "carrier frequency" of 45.75 MHz. The modulated input signal is amplified within demodulator 66 by high gain, tuned amplifier to form a switching signal having a frequency of 45.75 MHz. This switching signal is multiplied by the modulated incoming signal to produce a demodulated output signal across output terminals 78 and 80 and across current sources 82 and 84 which are connected between output terminals 78 and 80 and the positive power supply conductor 86. Current sources 82 and 84 provide loads to demodulator 66 and may replace load resistors otherwise used. Any one of a variety of known configurations can be utilized to form current sources 82 and 84. The demodulated differential output signal includes synchronizing signal components, color signal components, and luminance signal components. The desired components of the demodulated signal extend over a bandwidth starting at 0 hertz and extending up to approximately 5 MHz.

Amplifier 26 includes input terminal 88 which is connected to differential output terminal 78 and input terminal 90 which is connected to differential output terminal 80. The magnitude of the signal components applied to input terminals 78 and 80 is increased or amplified by amplifier 26 which provides a single-ended output signal at output terminal 92 having a predetermined D.C. bias level which might correspond to the white level of the video signal. Amplifier circuit 26 includes a first stage comprised of zener diode 91, NPN transistor 92, diode 94, resistor 96 and resistor 98. These components form a "turn-around" circuit. The base electrode of transistor 92 is connected through zener diode 91 to input terminal 88. Diode 94 and resistor 96 provided the bias and input voltage for transistor 92.

Amplifier 26 also includes a second stage including a series circuit comprised of current source 100, zener diode 102, diode 104 and resistor 106. Junction 118 between current source 100 and zener diode 102 is connected to input terminal 90. The second stage also includes NPN transistor 108 which has a base electrode connected to the anode of diode 104 and to the collector electrode of transistor 92. The emitter electrode of transistor 108 is connected through resistor 110 to the ground or reference potential and the collector electrode is connected through current source 112 to the positive power supply conductor 86.

Zero carrier bias supply 114 includes terminal 116 which is connected to the ground or reference potential and terminal 117 which is connected through resistor 119 to the collector of transistor 108.

The output circuit includes Darlington connected transistors 120 and 122. The base of transistor 120 is connected to the collector of transistor 108 and the emitter of transistors 122 is connected to output terminal 92. Conductor 86 is connected to the collectors of transistors 120 and 122 and the emitter of transistor 120 is connected to the base of transistor 122. The output signal is developed between output terminal 92 and a conductor which is at the ground or reference potential.

The quiescent signal state of amplifier 26 will next be considered. Input terminal 88 receives current, $I_1$, and input terminal 90 receives current, $I_2$. Current sources 82 and 84 each supply a current designated as $I_3$. Currents $I_{d1}$ and $I_{d2}$ are the output currents of demodulator 66. Current $I_1$ is the difference between currents $I_3$ and $I_{d1}$ and current $I_2$ is the difference between currents $I_3$ and $I_{d2}$. Under quiescent conditions, the two output currents, $I_{d1}$ and $I_{d2}$, from demodulator 66 are equal which means that currents $I_1$ and $I_2$ are equal. Current $I_1$ flows through zener 91, diode 94 and resistor 96 to form a bias at the base of transistor 92. Zener 90 provides a D.C. level at output terminal 78 of demodulator 66 which prevents some of the transistors therein from saturating. Current $I_2$ flows through zener diode 102, diode 104 and resistor 106. Zener 102 provides a D.C. level at output terminal 80 of demodulator 66 which prevents other transistors from saturating. Assuming that resistors 96 and 98 have equal values, transistor 104 will conduct all of current $I_2$. Consequently, none of current $I_2$ will flow through diode 104 and resistor 106. The only current flowing in diode 104 and resistor 106, at quiescent conditions is the current $I_4$ supplied by current source 100. Provided that resistor 106 has a value equal to N times the resistance of resistor 110, then the current conducted by transistor 108 is N times the current supplied by current source 100. "N" may be some number greater than 1 such as 2 or 2.5. Thus, by designing current source 112 to provide N times current $I_4$, the output current supplied to load resistor 119 by transistor 108 is zero at quiescent condition. Thus, under quiescent conditions the voltage at output terminal 92 is determined by the level established by zero carrier bias supply 114, which may have any one of a plurality of known configurations. The voltage delivered by bias supply 114 may be chosen to result in an output voltage at terminal 92 which approximates the "white" level of a negative going video signal. Current sources 100 and 112 provide a bias voltage to transistor 108 which prevents non-linear signal amplification at low signal levels. Current sources 84 and 100 may be replaced by a single current source supplying a constant current equal to the sum of currrents $I_3$ and $I_4$.

The dynamic mode of operation of synchronous demodulator 66 will next be considered. Circuit 66 is designed such that when a modulated input signal is applied, the magnitude of current $I_{d1}$ increases and the magnitude of current $I_{d2}$ decreases. Therefore, current $I_1$ decreases and current $I_2$ increases as the magnitude of the modulated signal increases. The bias voltage at the base of transistor 92 decreases in response to decreasing current $I_1$. Consequently, the voltage at the collector of transistor 92 increases and provides an increased voltage at node 118. Moreover, the increasing current $I_2$ causes diode 104 and resistor 106 to also provide an increasing voltage at node 118. Hence, the voltage change caused by currents $I_1$ and $I_2$ at node 118 results in a net increase in a positive direction of the voltage applied to the base of transistor 108. Thus, transistor 108 conducts a current which is drawn through the load and the Darlington circuit into its collector electrode. Consequently, the output potential at output terminal 92 across the load goes negative. Hence, the magnitude of the output current flowing in transistor 108 depends only on the differences of the magnitude of the currents flowing at output terminals 78 and 80 of demodulator 66, rather than on the absolute value of these currents.

Amplifier circuit 26 of FIG. 2 employs no lateral PNP transistors in the active signal path. The impedances of the zener diodes and of the resistors are chosen to have low values in order to increase the bandwidth of the amplifier. NPN transistors 92 and 108 have cut-off frequencies in excess of 300 megahertz. Consequently, operation at chroma frequencies on the order of 3.5 MHz is easily achieved without creating differential gain and phase problems that occur in prior art video amplifier circuits having PNP transistors. The bandwidth of amplifier 26 is controlled by the resistance of the output load and the stray capacitance occurring at the collector of transistor 108. To facilitate selection of the desired components of the demodulated signal while removing undesired components such as carrier harmonics, the bandwidth is set to approximately 6 MHz.

In one operative embodiment, the resistors and currents utilized in amplifier 26 have the following values:

| | |
|---|---|
| Resistor 96 | 300 ohms |
| Resistor 98 | 300 ohms |
| Resistor 106 | 1000 ohms |
| Resistor 110 | 500 ohms |
| Resistor 119 | 4.5 kilo-ohms |
| $I_{d1}$ and $I_{d2}$ | 1.5 milli-amperes |
| $I_3$ | 2.5 milli-amperes |
| $I_4$ | .15 milli-amperes |
| $NI_4$ | .30 milli-amperes |

What has been described, therefore, is an improved amplifier circuit suitable for being manufactured in monolithic integrated circuit form and for amplifying a television video signal. The amplifier performs differential to single-ended current conversion and has linear phase and amplitude amplification characteristics. Moreover, a stable quiescent amplifier output voltage is provided which is independent of the magnitude of the voltage supply. Although amplifier 26 has been described as a television video amplifier, it will be apparent to those skilled in the art that it is suited for other applications. For instance, by adjusting the magnitudes of the currents supplied by current sources 82 and 84, it is possible to adjust the level of the quiescent output voltage to a potential intermediate between the ground and B+ potentials. In this condition, amplifier 26 could amplify a demodulated audio signal, for instance.

It is contemplated that after having read the above description of the preferred embodiment, those skilled in the art may foresee other alterations and modifications which have not been pointed out with particularity above. Accordingly, this disclosure is intended as being in the nature of an explanatory illustration only and it is in no way to be considered as limiting. Therefore, the appended claims are to be interpreted as covering all modifications which fall within the true spirit and scope of the invention. Although specific types of components have been disclosed, for exemplary purposes, it should be understood that a variety of components may be utilized by those skilled in the art.

I claim:

1. An amplifier circuit suitable for linearly amplifying first and second differential input signals respectively applied to first and second input terminals thereof by a differential driving source and providing a single-ended output signal at an output terminal thereof, the amplifier circuit including in combination:

first stage means having an input terminal for receiving the first differential signal and an output terminal, said first stage means inverting said first differential signal;

first circuit means coupling said input terminal of said first stage means to the first input terminal of the amplifier circuit;

first zener diode means included in said first circuit means for preventing the differential driving source from becoming saturated, said first zener diode means having one electrode coupled to the first input terminal of the amplifier circuit and another electrode coupled to said input terminal of said first stage means so that the first differential input signal flows therethrough;

bias means coupled to said first zener diode means;

second stage means having an input terminal connected to said output terminal of said first stage means, said second stage means having an output terminal which is coupled to the output terminal of the amplifier circuit;

second circuit means coupling the second input terminal of the amplifier circuit to said input terminal of said second stage means;

second zener diode means included in said second circuit means for preventing the differential driving source from becoming saturated, said second zener diode means having one electrode coupled to the second input terminal of the amplifier circuit and another electrode coupled to said input terminal of said second stage means so that the second differential signal flows therethrough; and bias means coupled to said second zener diode means.

2. The amplifier circuit of claim 1 wherein said first stage means includes:

power supply conductor means providing a ground potential, electron control means having a control electrode connected to said first stage input terminal, a first electrode, and a second electrode connected to said first stage output terminal;

resistive means coupling said first electrode of said first electron control means to said power supply conductor means;

diode means having a first electrode connected to said control electrode of said electron control means and a second electrode; and another resistive means coupling said second electrode of said diode means to said power supply conductor means.

3. The amplifier circuit of claim 2 wherein said electron control means includes a NPN transistor having a base electrode forming said control electrode, an emitter electrode forming said first electrode, and a collector electrode forming said second electrode.

4. The amplifier circuit of claim 1 wherein said second stage means includes in combination:

power supply conductor means for providing a ground potential;

electron control means having a control electrode connected to said second stage input terminal, a first electrode, and a second electrode connected to said second stage output terminal;

resistive means coupling said first electrode of said electron control means to said power supply conductor;

diode means having a first electrode connected to said control electrode of said electron control means and a second electrode; and another resistive means coupling said second electrode of said diode means to said power supply conductor means.

5. The amplifier circuit of claim 4 wherein said electron control means includes a NPN transistor having a base electrode forming said control electrode, an emitter electrode forming said first electrode and a collector electrode forming said second electrode.

6. The amplifier circuit of claim 1 further including an output bias supply means providing an output voltage of a fixed predetermined magnitude to said output terminal of said second stage means to prevent output signal distortion in response to low level input signals.

7. An amplifier circuit which is suitable for manufacture in monolithic integrated circuit form and which linearly converts a differential driving signal into a single-ended output signal, said amplifier circuit being further suited to operate in cooperation with a differential demodulator which provides a first differential input signal to a first amplifier input terminal which has a magnitude that decreases in response to modulation and a second differential input signal to a second amplifier input terminal which has a magnitude which increases in response to modulation, said amplifier circuit including in combination:

first zener diode means for preventing the differential demodulator from becoming saturated, said first zener diode means having a first electrode connected to said first amplifier input terminal and a second electrode;

current source means coupled to said first electrode of said first zener diode means;

first stage means including a first electron control device having a control electrode connected to said second electrode of said first zener diode means, a first electrode and a second electrode;

second zener diode means for preventing the differential demodulator from becoming saturated, said second zener diode means having a first electrode connected to said second amplifier input terminal and a second electrode;

current source means coupled to said first electrode of said second zener diode means;

second stage means including a second electron control device having a control electrode connected to said second electrode of said second zener diode means and to said second electrode of said first electron control means, a first electrode and a second electrode; and first circuit means connecting said second electrode of said second electron control device to the amplifier output terminal.

8. The amplifier circuit of claim 7 further including in combination:

first power supply conductor means for providing a ground potential;

first bias network means including a first diode means and a first relative means connected in series between said control electrode of said first electron control device and said first power supply conductor means;

second resistive means connected between said first electrode of said first electron control device and said first power supply conductor; and said first resistive means and said second resistive means having equal values.

9. The amplifier circuit of claim 7 further including in combination:

first power supply conductor means for providing a ground potential;

second bias network means including second diode means and third resistive means connected in series between said control electrode of said second electron control device and said first power supply conductor means;

first current supply means having an output terminal connected to said control electrode of said second electron control device and providing a first current having a predetermined magnitude;

second current supply means having an output terminal connected to said second electrode of said second electron control device providing a second current having a magnitude that is a predetermined ratio to said magnitude of said first current; and fourth resistive means connected from said first electrode of said second electron control device to said first power supply conductor means, said third resistive means having a value which is said predetermined ratio to the value of said fourth resistive means.

10. The amplifier circuit of claim 7 wherein said first electron control device includes an NPN transistor and said second electron control means includes an NPN transistor.

* * * * *